(12) United States Patent
Segovia Fernandez et al.

(10) Patent No.: US 11,489,511 B2
(45) Date of Patent: Nov. 1, 2022

(54) HIGHLY DISPERSIVE BULK ACOUSTIC WAVE RESONATORS

(71) Applicant: TEXAS INSTRUMENTS INCORPORATED, Dallas, TX (US)

(72) Inventors: Jeronimo Segovia Fernandez, San Jose, CA (US); Peter Smeys, San Jose, CA (US); Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 893 days.

(21) Appl. No.: 16/236,601

(22) Filed: Dec. 30, 2018

(65) Prior Publication Data

US 2020/0212880 A1  Jul. 2, 2020

(51) Int. Cl.
| | |
|---|---|
| *H03H 3/02* | (2006.01) |
| *H03H 9/17* | (2006.01) |
| *H03H 9/13* | (2006.01) |
| *C23C 16/455* | (2006.01) |
| *C23C 14/35* | (2006.01) |
| *H01L 41/316* | (2013.01) |
| *H01L 41/29* | (2013.01) |

(52) U.S. Cl.
CPC ............ *H03H 9/175* (2013.01); *C23C 14/35* (2013.01); *C23C 16/45525* (2013.01); *H03H 3/02* (2013.01); *H03H 9/13* (2013.01); *H01L 41/29* (2013.01); *H01L 41/316* (2013.01); *H03H 2003/025* (2013.01)

(58) Field of Classification Search
CPC .... H03H 9/175; H03H 2003/025; H03H 9/13; H01L 41/29
See application file for complete search history.

(56) References Cited

U.S. PATENT DOCUMENTS

| | | | |
|---|---|---|---|
| 6,087,198 A | 7/2000 | Panasik | |
| 6,548,942 B1 | 4/2003 | Panasik | |
| 9,129,886 B2 | 9/2015 | Jacobsen et al. | |
| 9,503,047 B2 | 11/2016 | Jacobsen et al. | |
| 9,524,881 B2 | 12/2016 | Jiang et al. | |
| 9,660,603 B2 | 5/2017 | Jiang et al. | |
| 9,896,330 B2 | 2/2018 | Wachtler et al. | |
| 10,135,415 B2 | 11/2018 | Soman et al. | |
| 2006/0214747 A1* | 9/2006 | Lakin | H03H 9/586 333/191 |
| 2007/0267942 A1* | 11/2007 | Matsumoto | H03H 9/178 310/366 |
| 2010/0237742 A1* | 9/2010 | Tanaka | H03H 9/02228 310/313 D |
| 2011/0249889 A1 | 10/2011 | Kothandaraman et al. | |
| 2014/0049340 A1* | 2/2014 | Inoue | H03H 9/25 333/195 |

(Continued)

*Primary Examiner* — Bryan P Gordon
(74) *Attorney, Agent, or Firm* — Valerie M. Davis; Charles A. Brill; Frank D Cimino

(57) ABSTRACT

A resonator includes a substrate, an acoustic Bragg mirror disposed above the substrate, and a bottom metal layer disposed above the acoustic Bragg mirror. The resonator also includes a piezoelectric plate disposed above the bottom metal layer. The resonator further includes a top metal layer disposed above the piezoelectric plate. The top metal layer comprises multiple fingers within a single plane and the width of each of the fingers is between 75%-125% of a thickness of the piezoelectric plate.

19 Claims, 8 Drawing Sheets

(56) References Cited

U.S. PATENT DOCUMENTS

| | | | |
|---|---|---|---|
| 2014/0354109 A1* | 12/2014 | Grannen | H03H 9/171 |
| | | | 310/311 |
| 2015/0318461 A1* | 11/2015 | Jacobsen | H01L 41/0805 |
| | | | 310/365 |
| 2016/0182009 A1* | 6/2016 | Bhattacharjee | H01L 41/33 |
| | | | 310/313 R |
| 2017/0026029 A1 | 1/2017 | Bahai et al. | |
| 2017/0310299 A1* | 10/2017 | Bower | H03H 9/172 |
| 2017/0330841 A1 | 11/2017 | Cook et al. | |
| 2018/0246323 A1 | 8/2018 | Fedigan et al. | |
| 2019/0007020 A1 | 1/2019 | Yen | |
| 2019/0007023 A1 | 1/2019 | Yen | |

\* cited by examiner

HIGHLY DISPERSIVE BULK ACOUSTIC WAVE RESONATORS

BACKGROUND

Modern radio frequency (RF) technologies such as signal filters and oscillators require the adoption of stable frequency references that can ensure high-end performance, CMOS integration, and frequency tunability during fabrication. Bulk acoustic wave (BAW) devices, such as a BAW device 100 of FIG. 1, are formed by a piezoelectric stack 140 sandwiched between electrodes 130 and 150 and acoustic Bragg mirrors 120 and 160 on a substrate 110 in an unreleased acoustic structure in which its resonance frequency (t) is primarily defined by the acoustic phase velocity ($v_p$) and the height of the vibrating piezoelectric stack 140 ($h$) (FIG. 1) such that $f_r = V_p/h$. Consequently, the frequency is affected by the thickness of the piezoelectric stack 140, resulting in a fixed, limited frequency range for one fabrication process. Although mass load splits can be added to achieve certain frequency tunability on the same wafer, having additional steps further increase manufacturing time and cost. Frequency tunability is of paramount importance for filters, because the forming series and shunt resonators have different center frequencies, and oscillators, when various frequency modulators are implemented in the same RF front-end system.

SUMMARY

In one aspect of this description, a resonator includes a substrate, an acoustic Bragg mirror disposed above the substrate, and a bottom metal layer disposed above the acoustic Bragg mirror. The resonator also includes a piezoelectric plate disposed above the bottom metal layer. The resonator further includes a top metal layer disposed above the piezoelectric plate. The top metal layer includes multiple fingers within a single plane.

In another aspect of this description, a method of fabricating a resonator includes forming an acoustic Bragg mirror above a substrate. The method also includes forming a bottom metal layer above the acoustic Bragg mirror. The method further includes forming a piezoelectric plate above the bottom metal layer. The method yet further includes forming a top metal layer above the piezoelectric plate. The top metal layer includes multiple fingers within a single plane.

In yet another aspect of this description, a method of operating a resonator includes employing a resonator. The resonator includes a substrate, an acoustic Bragg mirror disposed above the substrate, and a bottom metal layer disposed above the acoustic Bragg mirror. The resonator also includes a piezoelectric plate disposed above the bottom metal layer. The resonator further includes a top metal layer disposed above the piezoelectric plate. The top metal layer includes multiple fingers within a single plane. The method of operating the resonator also includes applying voltage to the resonator such that an acoustically dispersive zero-order symmetrical mode ($S_0$) is induced in each finger.

DETAILED DESCRIPTION

For purposes of this description, the phrase "high dispersion" refers to the acoustically dispersive $S_0$-mode that is induced in each finger forming the highly dispersive bulk acoustic wave (HDBAW) resonator. The $S_0$ mode is an extensional mode of vibration whose frequency depends on the in-plane acoustic velocity and distance between top metal fingers. When the thickness of the piezoelectric material approaches the width of each finger the exhibited displacement becomes less extensional and shows deformation in the thickness direction, increasing the amount of electromechanical coupling that can be attained in the resonator. To achieve a value comparable to BAW, the width of each finger needs to be between 75% to 125% of the height of the piezoelectric layer (h).

In accordance with this description, a HDBAW resonator architecture enables frequency tunability in a single fabrication batch with no mass load splits and offers the advantages of BAW resonator technology, e.g., high-end performance, CMOS integration, and device linearity. The device is based on a piezoelectric plate sandwiched between metal layers and either a bottom acoustic Bragg mirror (FIGS. 2, 4A, 4B, 5A, 5B) or both bottom and top acoustic Bragg mirrors (FIG. 3). The acoustic Bragg mirrors are formed by multiple layers of alternating low acoustic impedance materials and high acoustic impedance materials. The thickness of each of these material layers is fixed to one quarter wavelength of the acoustic modes excited at resonance frequency. In the HDBAW resonator, the top metal layer includes multiple fingers and works as an electrode while the bottom metal layer can work as a floating plate (FIGS. 4A, 4B) or electrode (FIGS. 5A, 5B). To enable frequency tunability, the resonator combines thickness and lateral vibrations and its resonance frequency depends on the thickness of the piezoelectric plate as well as the pitch and width of the fingers. Moreover, the acoustic Bragg mirrors are designed to have a wide acoustic isolation bandwidth that covers the entire range of resonance frequencies. To achieve a high degree of crystallinity in the piezoelectric plate, the piezoelectric material is deposited by, for example, RF magnetron sputtering or atomic layer deposition (ALD) on top of a flat metal surface (i.e., the bottom metal layer/plate).

Figure 1:
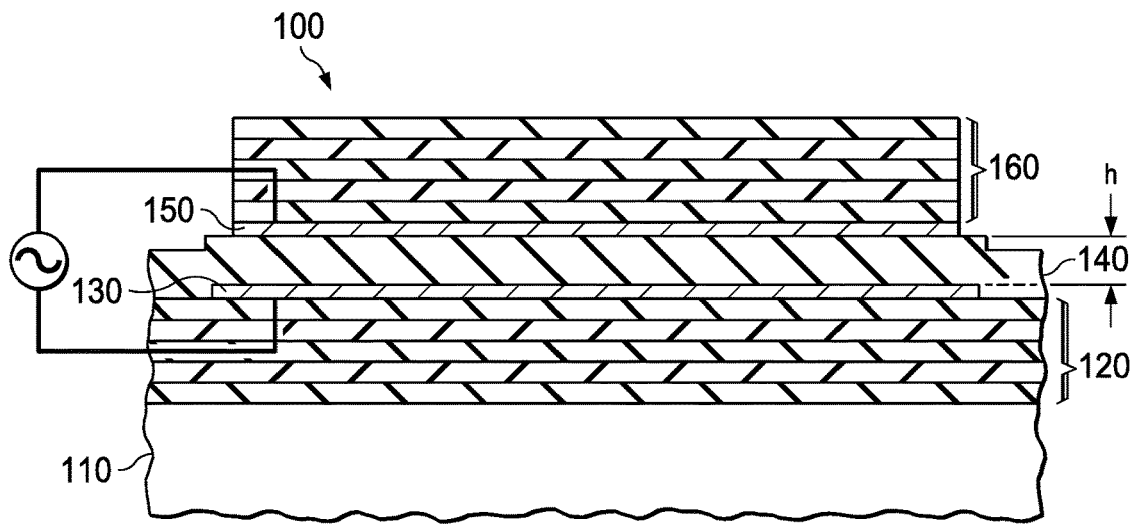
FIG. 1 is a cross-sectional side view of a bulk acoustic wave (BAW) resonator.
Figure 6A:
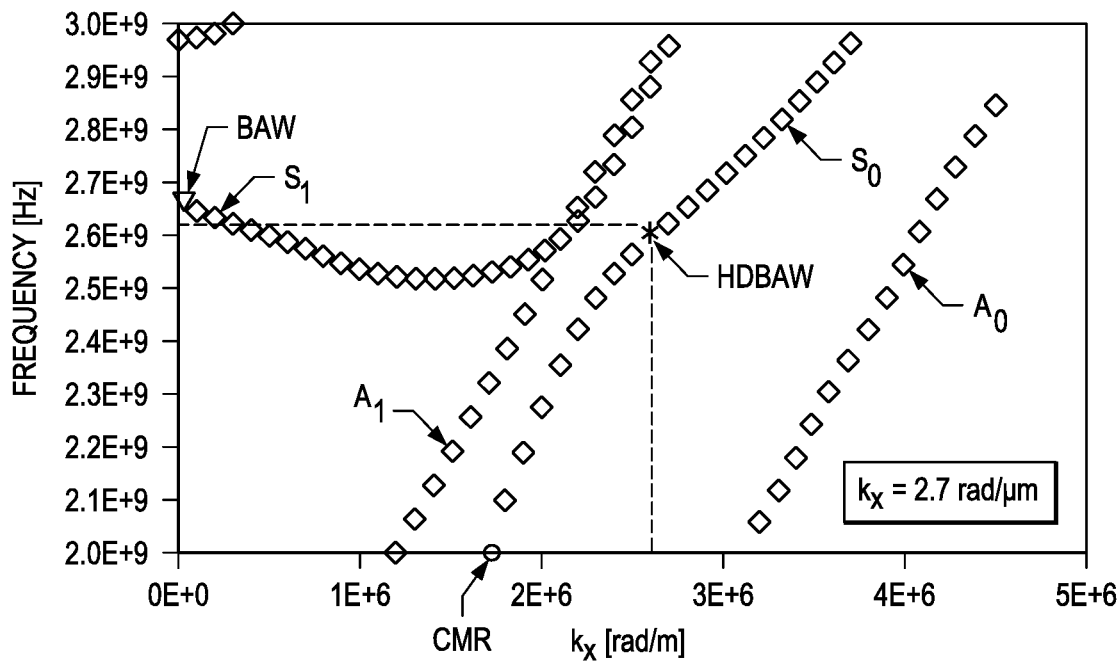
FIGS. 6A-6B plot the lateral dispersion of frequency and electromechanical coupling ($K^2$) exhibited in an infinite plate formed by a 700 nm-thick AlN piezoelectric layer sandwiched between 300 nm-thick Mo metal layers and acoustic Bragg mirrors with alternating $SiO_2$ and TiW layers and identify the mode of vibration associated with HDBAW, BAW, and CMR resonators.
Figure 6B:
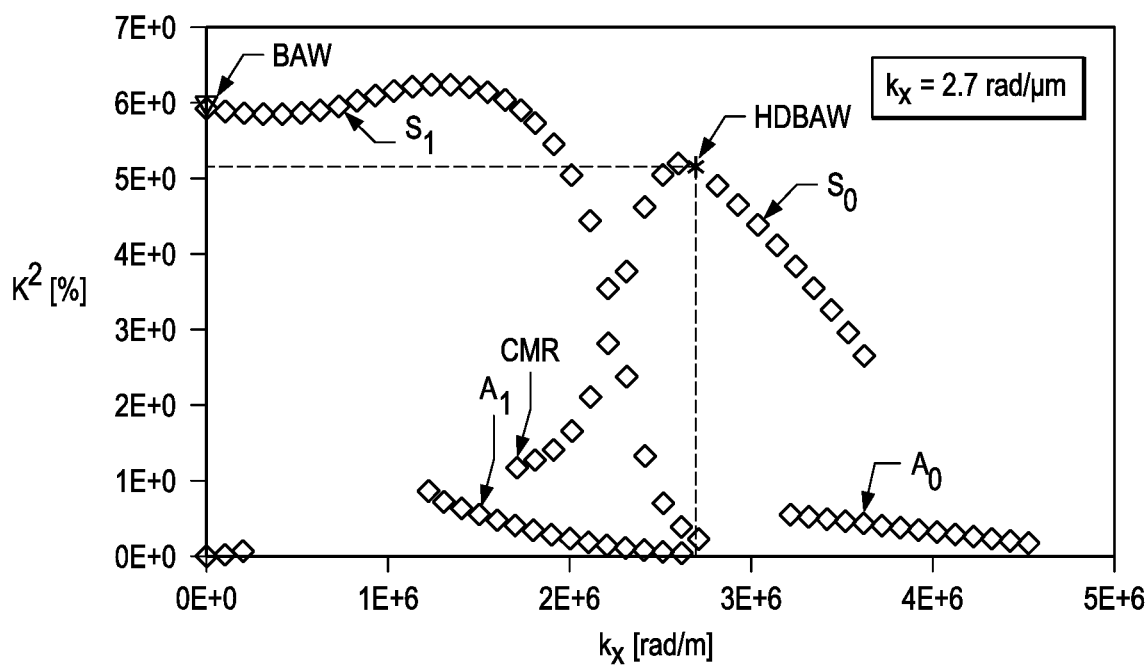

A structural difference between BAW and HDBAW resonators is that the latter presents at least one top electrode layer including multiple fingers. This electrode layer(s) of the HDBAW resonator induces a highly-dispersive $S_0$-mode in each finger (in contrast to a very low dispersive $S_1$-mode exhibited by a BAW resonator such as shown in FIG. 1 which has a non-fingered top metal layer) that ensures a certain range of lithographic tunability while maintaining similar levels of electromechanical coupling. FIGS. 6A and 6B present the acoustic dispersion characteristics of an infinite composite piezoelectric structure in which the lateral dispersion correlates to the width ($w_f$) and pitch of the fingers. FIG. 6A compares the frequency characteristics of BAW and HDBAW resonators and shows that BAW has a near-zero frequency slope while HDBAW exhibits a relatively large frequency slope. FIG. 6B compares the electromechanical coupling characteristics of BAW and HDBAW resonators and shows that both can achieve similar values. $A_0$ and Ai represent the lowest frequency antisymmetric modes inherent to the infinite piezoelectric stack that are not excited by either BAW or HDBAW resonators.

Other fingered acoustic resonator structures, such as contour mode resonators (CMRs) or lamb wave resonators (LWRs), can also define their resonance frequency lithographically by changing the electrode's width and pitch. However, they require releasing steps to confine the acoustic energy, which makes them unsuitable for high-power, high-vibration applications, and exhibit inherently low electromechanical coupling and quality factor, which limits their application for RF front-end filter and low-phase noise oscillators. Aspects of this description present an unreleased acoustic structure (with either bottom, or bottom and top acoustic Bragg mirrors) that exhibits larger electromechanical coupling and quality factor over the resonance frequency ratio.

Figure 7A:
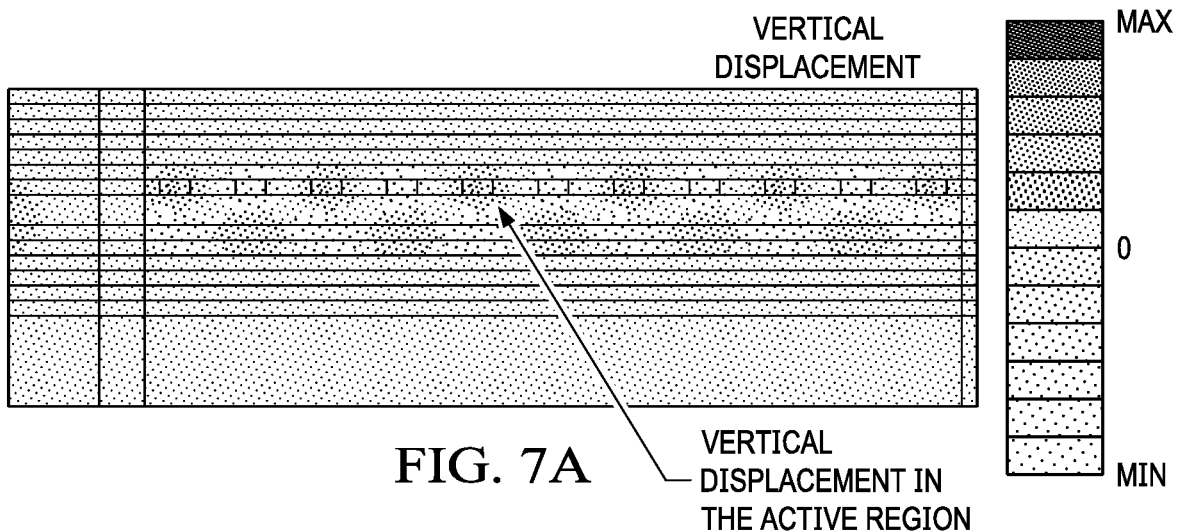
FIGS. 7A-7C are respective plots of thickness, lateral, and absolute displacements exhibited during operation of a HDBAW resonator, in accordance with this description.
Figure 7B:
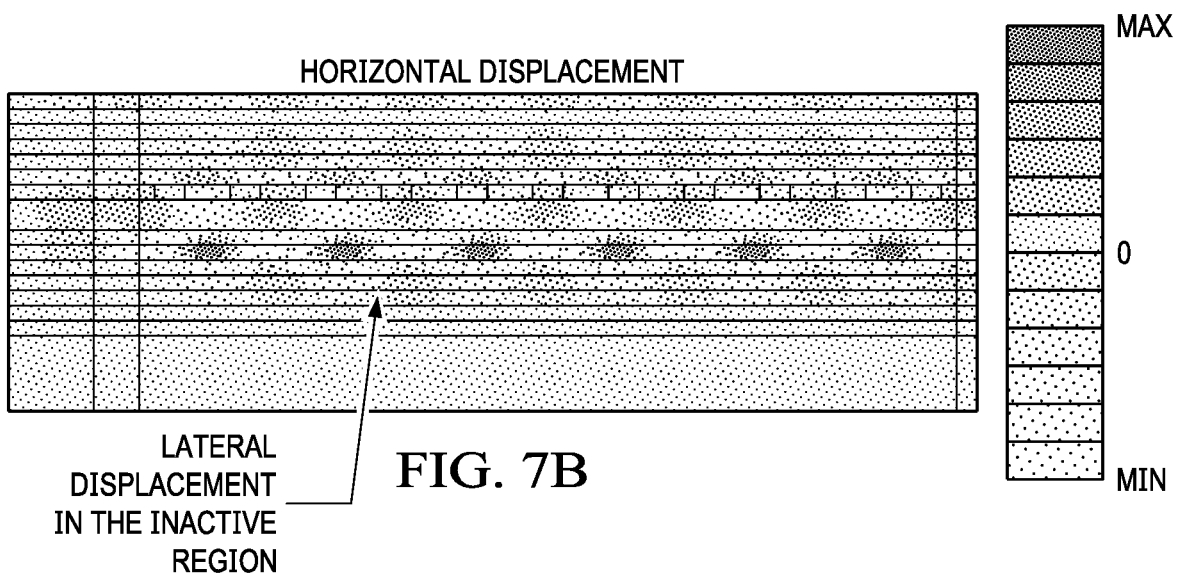
Figure 7C:
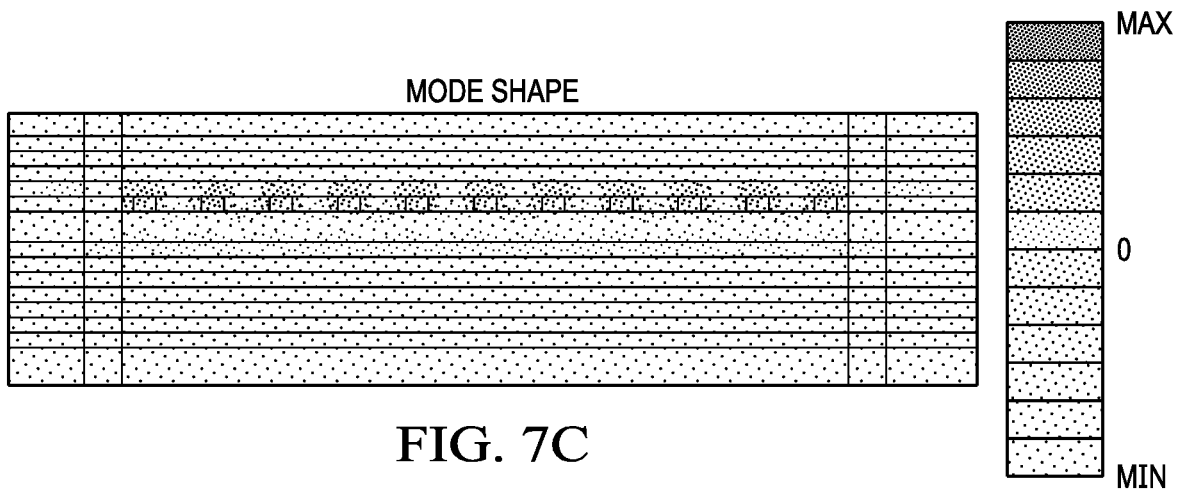

The inclusion of acoustic Bragg mirrors between the substrate and bottom metal layer as well as above the top metal layer eliminates the need for releasing and encapsulating the resonator structure. FIGS. 7A-7C are respective plots of thickness, lateral, and absolute displacements exhibited during operation of a HDBAW resonator. Accordingly, the combination of vertical (FIG. 7A) and lateral (FIG. 7B) wave displacements enables the resonator's dispersive $S_0$-mode in contrast to CMR and LWR, which only rely on lateral vibrations. This combined mode of vibration as illustrated in FIGS. 7A and 7B increases the maximum electromechanical coupling that can be achieved in the HDBAW resonator. Finally, the HDBAW resonator can exhibit a larger quality factor over resonance frequency ratio than CMR and LWR. In essence, acoustic energy dissipation is reduced by confining most of the displacement under the electrode(s) within the top metal layer (as illustrated in FIG. 7C) and material bulk losses are alleviated through excitation of a highly oriented piezoelectric plate.

Figure 8A:
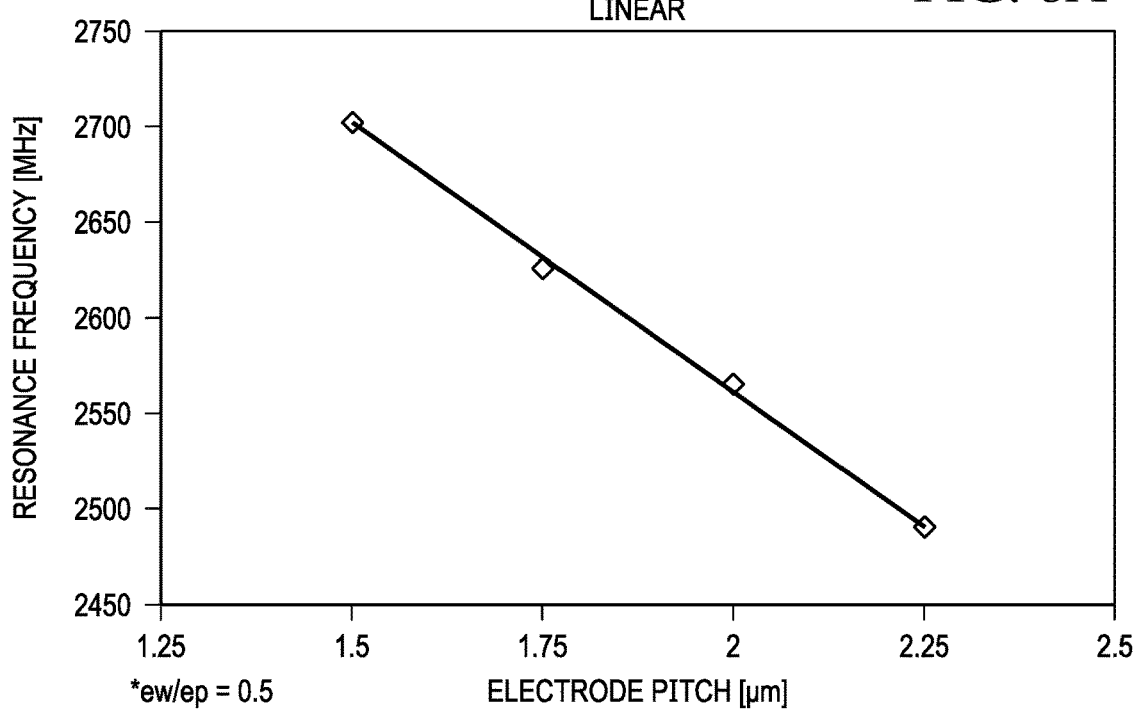
FIGS. 8A-8B are respective plots of varied finger pitch (e.g., $w_f$+s, in FIG. 4B) and finger width ($w_f$) compared with resonance frequencies of a HDBAW resonator, in accordance with this description.
Figure 8B:
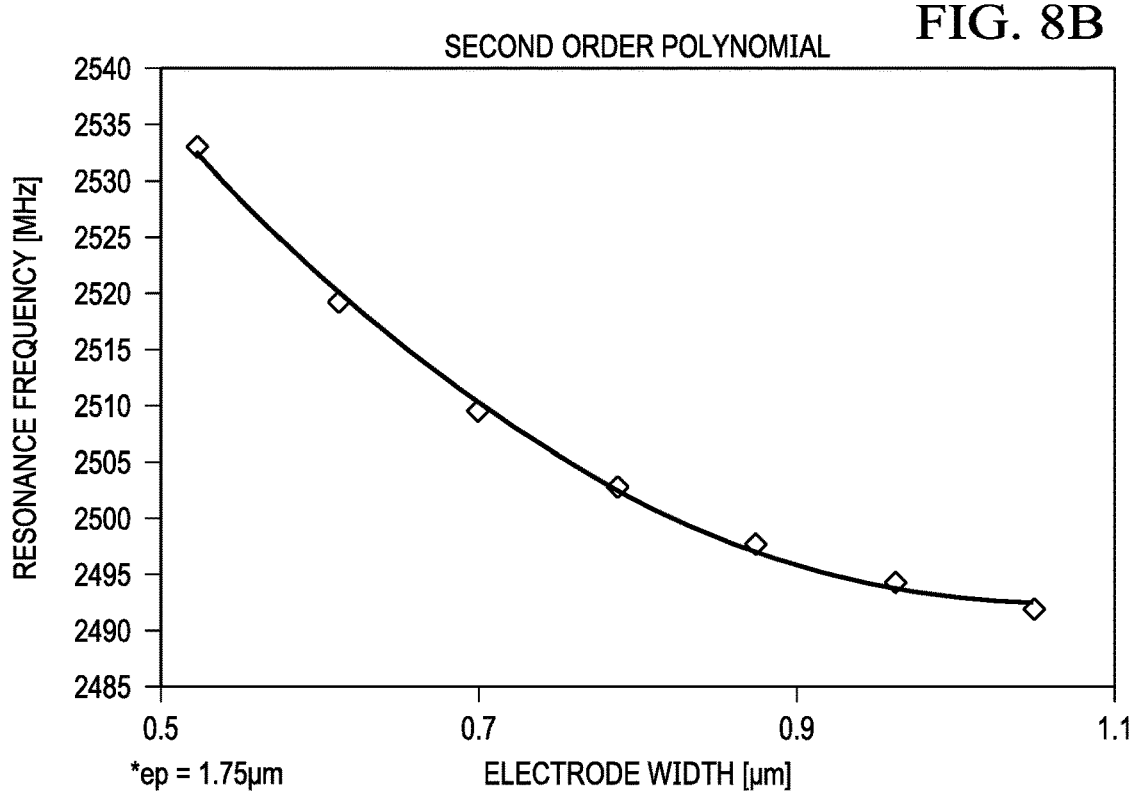

FIGS. 8A-8B are respective plots of varied electrode (finger) pitch ("ep" as shown in FIGS. 8A and 8B) and electrode (finger) width ("ew" as shown in FIG. 8A) compared with resonance frequencies of a HDBAW resonator including 700 nm-thick AlN piezoelectric layer sandwiched between 300 nm-thick Mo metal layers and acoustic Bragg mirrors with alternating $SiO_2$ and TiW layers. In FIG. 8A, electrode pitch may be varied to achieve frequency reconfiguration. In FIG. 8B, the HDBAW resonator may be designed at the minimum frequency-to-electrode width sensitivity to reduce critical dimension (CD) lithographic impact. As shown in FIG. 8A, if electrode pitch is changed (while not changing the electrode width), then the resonance frequency changes linearly. Likewise, as shown in FIG. 8B, if electrode width is changed (while not changing the electrode pitch), then the resonance frequency changes as a second-order polynomial.

Figure 2:
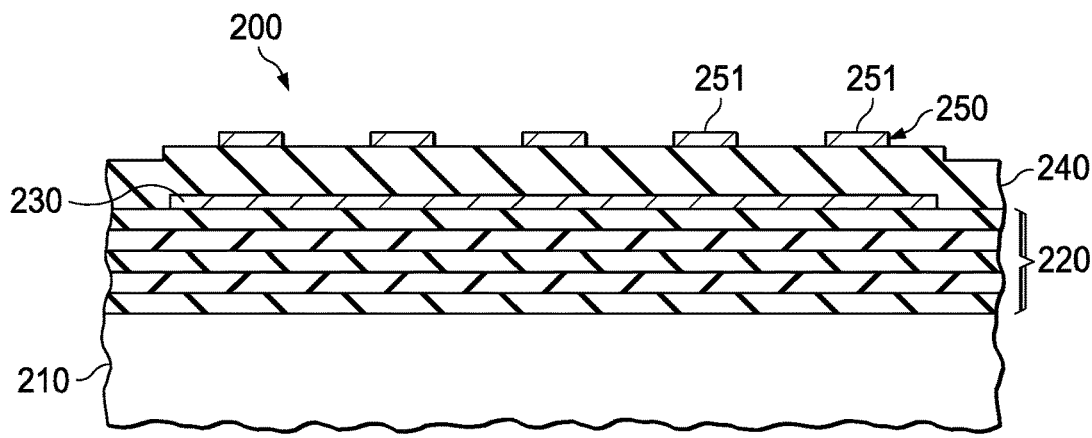
FIG. 2 is a cross-sectional side view of a highly dispersive bulk acoustic wave (HDBAW) resonator with a bottom acoustic Bragg mirror, in accordance with this description.
Figure 3:
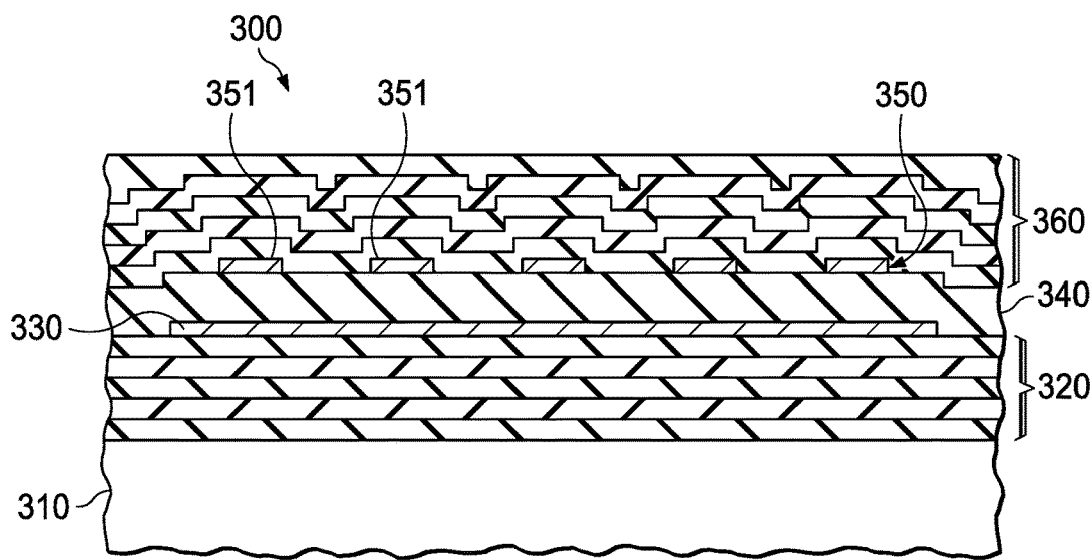
FIG. 3 is a cross-sectional side view of a HDBAW resonator with a bottom acoustic Bragg mirror and a top acoustic Bragg mirror, in accordance with this description.

With reference to FIG. 2, in one aspect of this description, a resonator 200 includes a substrate 210, an acoustic Bragg mirror 220 disposed above the substrate 210, and a bottom metal layer 230 disposed above the acoustic Bragg mirror 220. The resonator 200 also includes a piezoelectric plate 240 disposed above the bottom metal layer 230. The resonator 200 further includes a top metal layer 250 disposed above the piezoelectric plate 240. The top metal layer 250 includes multiple fingers 251 within a single plane.

The substrate 210 may include Si and may be between 275 μm and 925 μm in thickness depending on the wafer diameter.

The acoustic Bragg mirror 220 may include alternating layers of $SiO_2$ and TiW in order to achieve high acoustic impedance mismatch, and each layer may be between 10 to 1000 nm in thickness as a result of being one quarter wavelength of the acoustic modes excited by the HDBAW at resonance.

The bottom metal layer 230 may include Mo or Pt and its thickness may be between 10 to 1000 nm.

The piezoelectric plate 240 may include AlN or doped-AlN and its thickness may be between 50 to 5000 nm.

The top metal layer 250 (including, for example, the fingers 251) may include Mo or Pt and its thickness may be between 10 to 1000 nm. The thicknesses of the bottom metal layer 230, piezoelectric plate 240, and top metal layer 250 are designed to meet the acoustic phase velocity and half wavelength of the piezoelectric stack that define the HDBAW resonant frequency.

In an example, with reference to FIG. 3, the acoustic Bragg mirror is a bottom acoustic Bragg mirror 320; and the resonator 300 further includes a top acoustic Bragg mirror 360 disposed above the top metal layer 350. The resonator 300 also includes a substrate 310, a bottom metal layer 330, a piezoelectric plate 340, and a top metal layer 350. The top metal layer 350 includes multiple fingers 351 within a single plane. The top acoustic Bragg mirror 360 may include alternating layer(s) of $SiO_2$ and TiW in order to achieve high acoustic impedance mismatch, and each layer may be between 10 to 1000 nm in thickness as a result of being one quarter wavelength of the acoustic modes excited by the HDBAW at resonance.

Figure 4A:
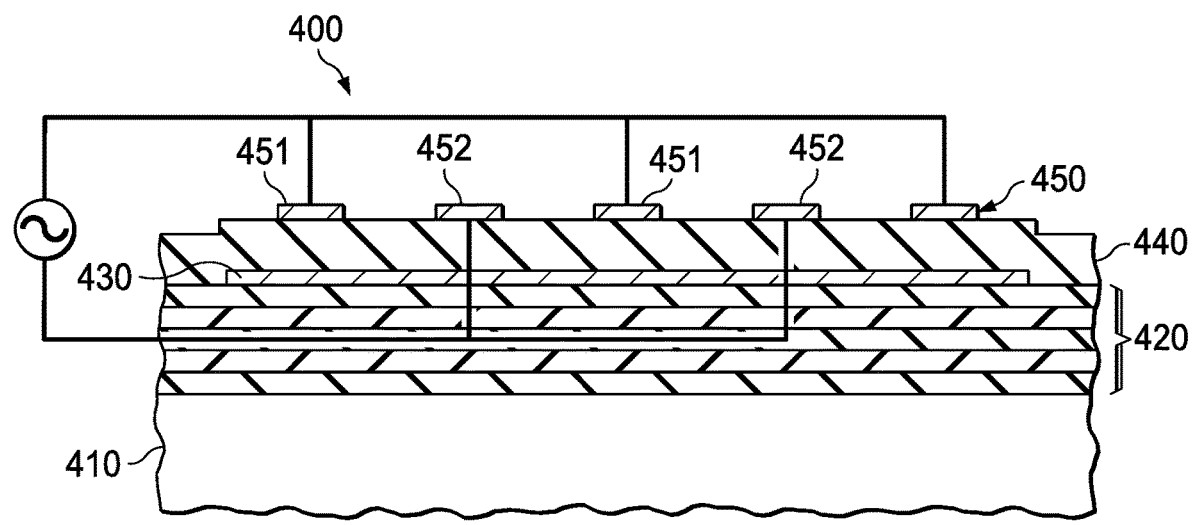
FIG. 4A is a cross-sectional side view of a HDBAW resonator similar to the resonator of FIG. 2 along with a bottom metal layer serving as a non-electrified floating plate, and a top metal layer including multiple fingers forming first and second electrodes which are interdigitated, in accordance with this description.
Figure 5A:
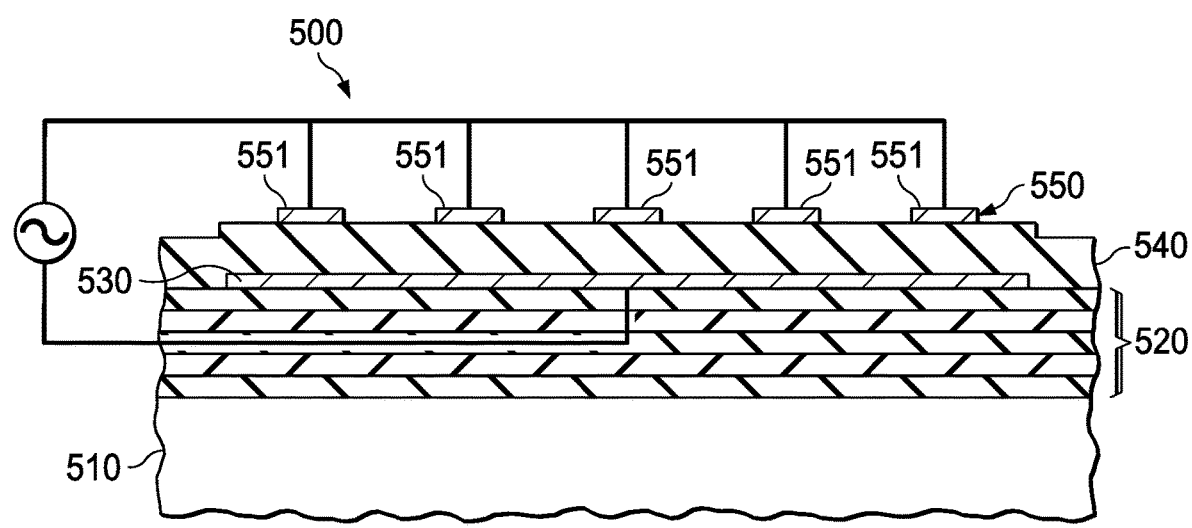
FIG. 5A is a cross-sectional side view of a HDBAW resonator similar to the resonator of FIG. 2 along with a top metal layer including multiple fingers which serve as a first electrode, and a bottom metal layer which serves as a second electrode, in accordance with this description.
Figure 5B:
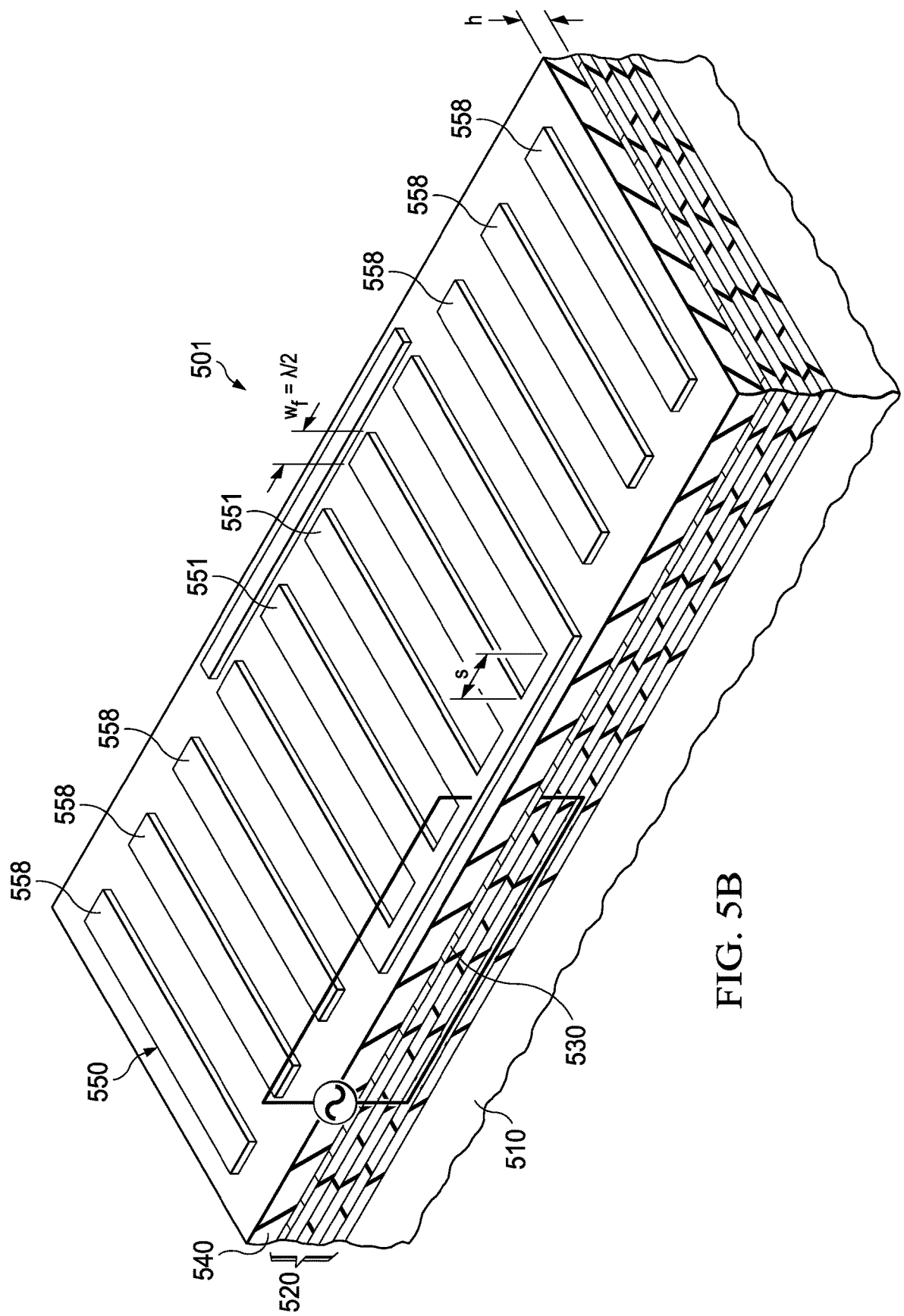
FIG. 5B is a perspective view of the HDBAW resonator shown in FIG. 5A with the top metal layer further including non-electrified strips on opposing sides of the fingers.

In an example, with reference to FIG. 4A, the bottom metal layer 430 serves as a non-electrified floating plate; the multiple fingers 451, 452 form respective first and second electrodes which are interdigitated such that the fingers 451, 452 of the first electrode and second electrode are alternately disposed, respectively; and the finger(s) 451 of the first electrode is/are configured to connect to a first voltage and the finger(s) 452 of the second electrode is/are configured to connect to a second voltage different than the first voltage. The resonator 400 also includes a substrate 410, an acoustic Bragg mirror 420, a piezoelectric plate 440, and a top metal layer 450 which includes the fingers 451, 452. The fingers 451, 452 are positioned within a single plane.

In an example, with reference to FIG. 5A, the fingers 551 serve as a first electrode; the bottom metal layer 530 serves as a second electrode; and the fingers 551 are configured to connect to a first voltage and the bottom metal layer 530 is configured to connect to a second voltage different than the first voltage. The resonator 500 also includes a substrate 510, an acoustic Bragg mirror 520, a piezoelectric plate 540, and a top metal layer 550 which includes the fingers 551. The fingers 551 are positioned within a single plane.

Figure 4B:
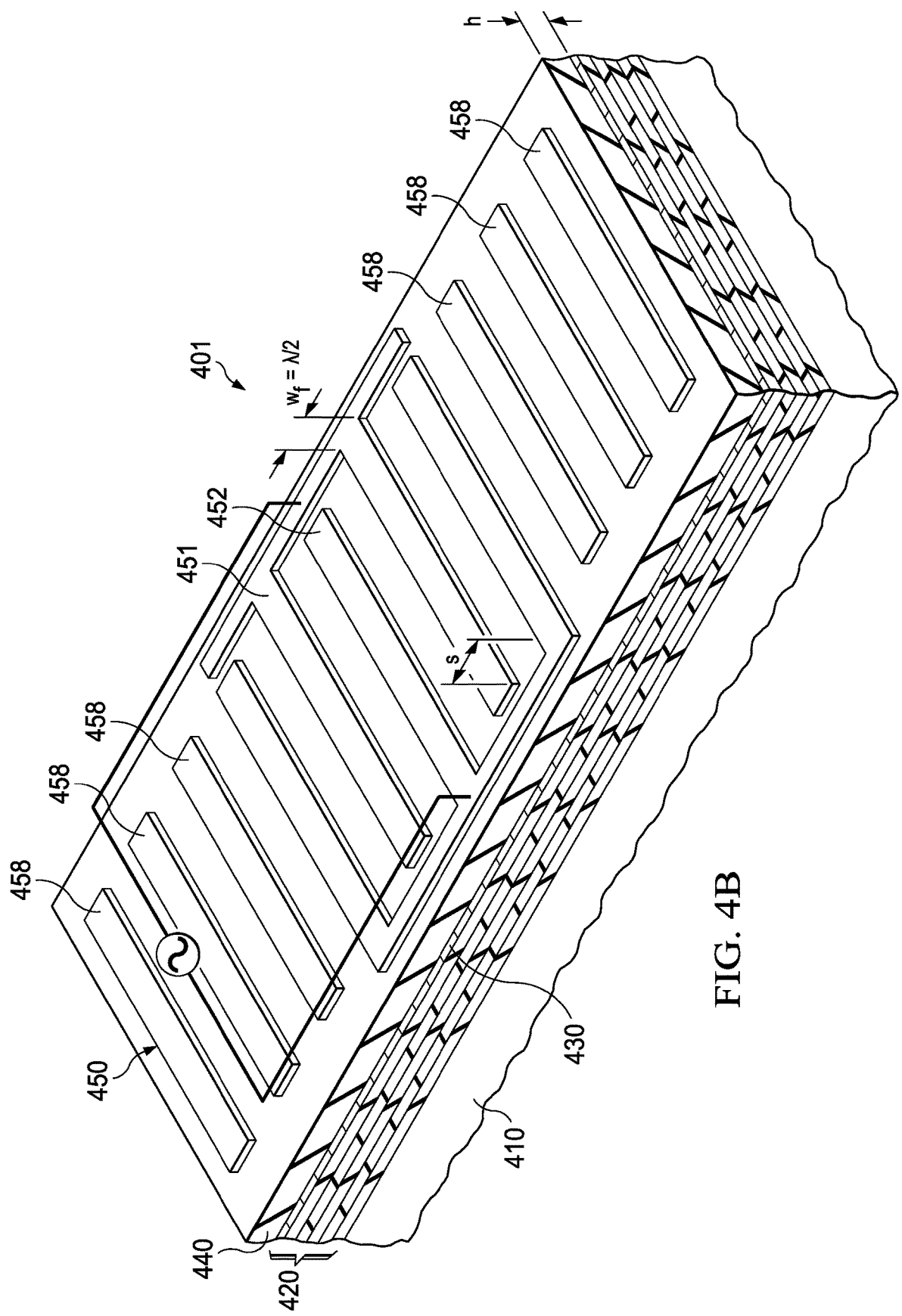
FIG. 4B is a perspective view of the HDBAW resonator shown in FIG. 4A with the top metal layer further including non-electrified strips on opposing sides of the fingers.

In an example, with reference to FIGS. 4B and 5B, the top metal layer 450, 550 further includes strips 458, 558 within the plane and surrounding the fingers 451, 452, 551 on two opposing sides of the fingers 451, 452, 551; and the strips 458, 558 are free from electrical connection. The fingers 451, 452, 551 and strips 458, 558 are positioned within a single plane. Specifically, FIG. 4B is a perspective view of a HDBAW resonator 401 similar to the HDBAW resonator 400 shown in FIG. 4A but with the top metal layer 450 further including non-electrified strips 458 on opposing sides of the fingers 451, 452. And FIG. 5B is a perspective view of a HDBAW resonator 501 similar to the HDBAW resonator 500 shown in FIG. 5A but with the top metal layer 550 further including non-electrified strips 558 on opposing sides of the fingers 551. In either FIG. 4B or FIG. 5B, the condition for resonance requires that the width of each finger ($w_f$) is between 75% and 125% of the height of piezoelectric layer (h).

The strips 458, 558 may be disposed in a similar pattern (spacing between strips, width of each strip, and thickness of the strips) and within the same plane as the fingers 451, 452, 551 and may include the same, similar, or different material as the fingers. The dimensions are customizable dependent on the resonance frequency desired. The spacing between the fingers (and between the optional strips) may be approximately the same as the finger width. The width of each finger (and each optional strip) should be between 75% and 125% of the piezoelectric layer thickness to achieve comparable electromechanical coupling to that exhibited in BAW. The thickness of the fingers (and of the optional strips) may be between 10 to 1000 nm based on the requirement for resonator operation frequency.

A purpose of providing the strips is to boost/improve the quality factor at the parallel resonance frequency ($Q_p$) by confining the acoustic energy inside the resonator.

In an example, with reference to FIGS. 2-5B, a width of each of the fingers 251, 351, 451, 452, 551, is between 75-125% of a thickness of the piezoelectric plate 240, 340, 440, 540.

Figure 9:
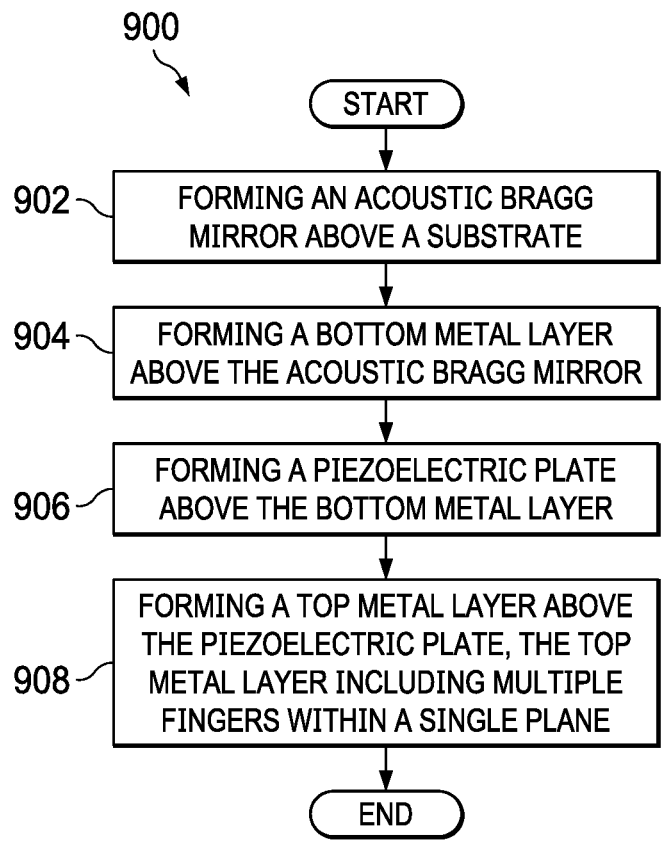
FIG. 9 is a flowchart illustrating a method of fabricating a resonator, in accordance with this description.

With reference to FIG. 9, in another aspect of this description, a method 900 of fabricating a resonator includes forming an acoustic Bragg mirror above a substrate (block 902). The method 900 also includes forming a bottom metal layer above the acoustic Bragg mirror (block 904). The method 900 further includes forming a piezoelectric plate above the bottom metal layer (block 906). The method 900 yet further includes forming a top metal layer above the piezoelectric plate, the top metal layer including multiple fingers within a single plane (block 908).

In an example of the method of fabricating a resonator, the acoustic Bragg mirror is a bottom acoustic Bragg mirror; and the method further includes forming a top acoustic Bragg mirror above the top metal layer.

In an example of the method of fabricating a resonator, the bottom metal layer serves as a non-electrified floating plate; the multiple fingers form first and second electrodes that are interdigitated to alternately dispose the fingers of the first electrode and second electrode, respectively; and the finger(s) of the first electrode is/are configured to connect to a first voltage and the finger(s) of the second electrode is/are configured to connect to a second voltage different than the first voltage.

In an example of the method of fabricating a resonator, the fingers serve as a first electrode; the bottom metal layer serves as a second electrode; and the fingers are configured to connect to a first voltage and the bottom metal layer is configured to connect to a second voltage different than the first voltage.

In an example of the method of fabricating a resonator, the top metal layer further includes strips within the plane and surrounding the fingers on two opposing sides of the fingers; and the strips are free from electrical connection.

In an example of the method of fabricating a resonator, a width of each of the fingers is between 75-125% of a thickness of the piezoelectric plate.

In an example of the method of fabricating a resonator, the forming of the piezoelectric plate is performed via a radiofrequency (RF) magnetron sputtering process or an atomic layer deposition (ALD) process.

Figure 10:
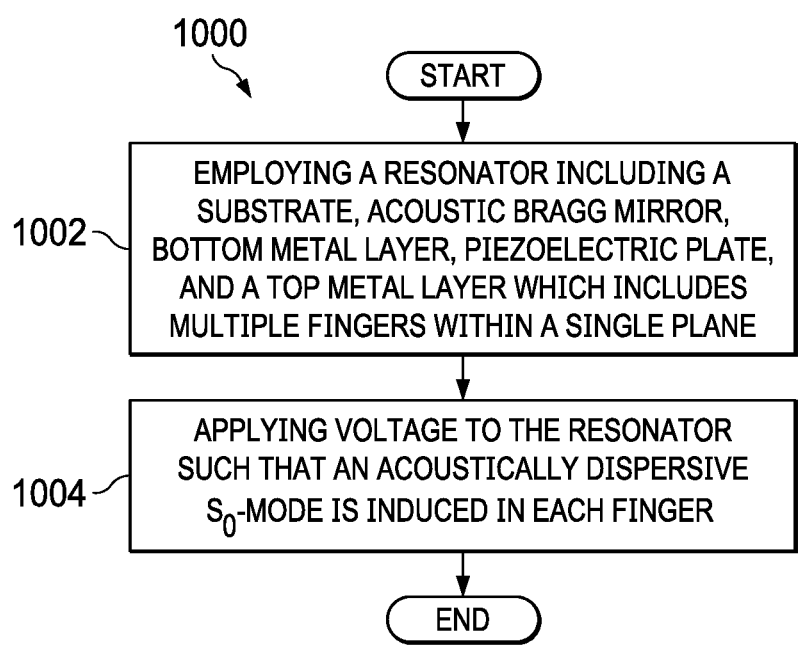
FIG. 10 is a flowchart illustrating a method of operating a resonator, in accordance with this description.

With reference to FIG. 10, in yet another aspect of this description, a method 1000 of operating a resonator includes employing a resonator (block 1002). The resonator includes a substrate, an acoustic Bragg mirror disposed above the substrate, and a bottom metal layer disposed above the acoustic Bragg mirror. The resonator also includes a piezoelectric plate disposed above the bottom metal layer. The resonator further includes a top metal layer disposed above the piezoelectric plate. The top metal layer includes multiple fingers within a single plane. The method 1000 also includes applying voltage to the resonator to induce an acoustically dispersive $S_0$-mode in each finger (block 1004).

In an example of the method of operating a resonator, the acoustic Bragg mirror is a bottom acoustic Bragg mirror; and the resonator further includes a top acoustic Bragg mirror disposed above the top metal layer.

In an example of the method of operating a resonator, the bottom metal layer serves as a non-electrified floating plate; the multiple fingers form first and second electrodes that are interdigitated to alternately dispose the fingers of the first electrode and second electrode, respectively; and the applying voltage to the resonator includes: applying a first voltage to the finger(s) of the first electrode; and applying a second voltage different than the first voltage to the finger(s) of the second electrode.

In an example of the method of operating a resonator, the fingers serve as a first electrode; the bottom metal layer serves as a second electrode; and the applying voltage to the resonator includes: applying a first voltage to the fingers; and applying a second voltage different than the first voltage to the bottom metal layer.

In an example of the method of operating a resonator, the top metal layer further includes strips within the plane and surrounding the fingers on two opposing sides of the fingers; and the strips are free from electrical connection.

In an example of the method of operating a resonator, a width of each of the fingers is between 75-125% of a thickness of the piezoelectric plate.

Aspects of a HDBAW resonator of this description therefore enables frequency reconfiguration in an unreleased substrate and exhibits high electromechanical coupling and quality factor. To boost/improve the quality factor at the series resonance frequency (Qs), the number of connected fingers in the center (i.e., between the non-connected, non-electrified strips) may be increased. To boost/improve the quality factor at the parallel resonance frequency ($Q_p$), the number of non-connected, non-electrified strips may be increased.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this description may be employed in combination with features in other examples described herein, and such combinations are considered to be within the spirit and scope of this description.

In this description, the term "couple" or "couples" means either an indirect or direct wired or wireless connection. Thus, if a first device couples to a second device, that connection may be through a direct connection or through an indirect connection via other devices and connections.

Modifications are possible in the described embodiments, and other embodiments are possible, within the scope of the claims.

What is claimed is:

1. A resonator comprising:
    a substrate;
    a first acoustic Bragg mirror on the substrate;
    a metal plate on the acoustic Bragg mirror;
    a piezoelectric plate on the metal plate;
    a first electrode and a second electrode on the piezoelectric plate, the first electrode including first fingers, the second electrode including second fingers, the first and second fingers alternating; and
    a second acoustic Bragg mirror on the first and second alternating fingers.

2. The resonator of claim 1, wherein the resonator is configured to electrically connect to a first voltage at the first electrode and electrically connect to a second voltage at the second electrode without an electrical connection at the metal plate.

3. The resonator of claim 1, further comprising a strip on the piezoelectric plate that is free from electrical connection.

4. The resonator of claim 1, wherein a width of each of the fingers is between 75%-125% of a thickness of the piezoelectric plate.

5. A method of fabricating a resonator, the method comprising:
    forming a first acoustic Bragg mirror on substrate;
    forming a first metal layer on the first acoustic Bragg mirror;
    forming a piezoelectric plate on the first metal layer; and
    forming a second metal on the piezoelectric plate, the second metal layer including fingers;
    forming a second acoustic Bragg mirror on the fingers, the second acoustic Bragg mirror having a surface with apertures into which the fingers lie.

6. The method of claim 5, wherein the first metal layer serves as a non-electrified floating plate, wherein the fingers form first and second electrodes that are interdigitated to alternately dispose the fingers of the first electrode and second electrode, respectively, and wherein the finger(s) of the first electrode is/are configured to connect to a first voltage and the finger(s) of the second electrode is/are configured to connect to a second voltage different than the first voltage.

7. The method of claim 5, wherein the fingers serve as a first electrode, wherein the first metal layer serves as a second electrode, and wherein the fingers are configured to connect to a first voltage and the first metal layer is configured to connect to a second voltage different than the first voltage.

8. The method of claim 5, wherein the second metal layer further comprises strips within the plane and surrounding the fingers on two opposing sides of the fingers, and wherein the strips are free from electrical connection.

9. The method of claim 5, wherein a width of each of the fingers is between 75%-125% of a thickness of the piezoelectric plate.

10. The method of claim 5, wherein the piezoelectric plate is formed via a radiofrequency (RF) magnetron sputtering process or an atomic layer deposition (ALD) process.

11. A resonator comprising:
    a substrate;
    an acoustic Bragg mirror on the substrate;
    a first electrode on the acoustic Bragg mirror;
    a piezoelectric plate on the first electrode;
    a second electrode on the piezoelectric plate, the second electrode including fingers having a width between 75%-125% of a height of the piezoelectric plate, in which the resonator is configured to electrically connect to a first voltage at the first electrode and electrically connect to a second voltage at the fingers; and
    a second acoustic Bragg mirror on the fingers.

12. A resonator comprising:
    a substrate;
    a first acoustic mirror on the substrate;
    a metal plate on the acoustic mirror;
    a piezoelectric plate on the metal plate;
    metal fingers on the piezoelectric plate; and
    a second acoustic mirror on the metal fingers, the second acoustic mirror having a surface with apertures into which the fingers lie.

13. The resonator of claim 12, wherein the fingers have a width between 75%-125% of a height of the piezoelectric plate.

14. A resonator comprising:
    a substrate;
    a first acoustic mirror on the substrate;
    a metal plate on the acoustic mirror;
    a piezoelectric plate on the metal plate;
    metal fingers on the piezoelectric plate; and
    a second acoustic mirror on the metal fingers.

15. The resonator of claim 14, wherein the fingers have a width between 75%-125% of a height of the piezoelectric plate.

16. A resonator comprising:
    a substrate;
    a first acoustic mirror on the substrate;
    a metal plate on the acoustic mirror;
    a piezoelectric plate on the metal plate;
    metal fingers on the piezoelectric plate, in which the metal fingers are an outermost metal layer of the resonator.

17. The resonator of claim 16, wherein the metal fingers have a width between 75%-125% of a height of the piezoelectric plate.

18. The resonator of claim 16, wherein the metal fingers are configured as a first voltage electrode, and the metal plate is configured as a second voltage electrode.

19. The resonator of claim 16, further comprising a first voltage electrode having a first number of the metal fingers and a second voltage electrode having a second number of the metal fingers, in which the first number of the metal fingers are interdigitated with the second number of the metal fingers.

\* \* \* \* \*